(12) United States Patent
Pavelchek et al.

(10) Patent No.: US 6,261,743 B1
(45) Date of Patent: Jul. 17, 2001

(54) ANTIREFLECTIVE COATING COMPOSITIONS COMPRISING PHOTOACID GENERATORS

(75) Inventors: Edward K. Pavelchek, Stow; Manuel DoCanto, Stoughton, both of MA (US)

(73) Assignee: Shipley Company, L.L.C.

( * ) Notice: Subject to any disclaimer, the term of this patent is extended or adjusted under 35 U.S.C. 154(b) by 0 days.

(21) Appl. No.: 09/058,343

(22) Filed: Apr. 10, 1998

Related U.S. Application Data

(62) Division of application No. 08/797,741, filed on Feb. 6, 1997, now Pat. No. 5,939,236.

(51) Int. Cl.⁷ .............................. G03F 7/30; G03C 1/825

(52) U.S. Cl. .................. 430/325; 430/156; 430/326; 430/510

(58) Field of Search ................................ 430/325, 326, 430/510, 156

(56) References Cited

U.S. PATENT DOCUMENTS

| | | |
|---|---|---|
| 4,060,656 | 11/1977 | Naka et al. . |
| 4,362,809 | 12/1982 | Chen et al. . |
| 4,370,405 | 1/1983 | O'Toole et al. . |
| 4,576,898 | 3/1986 | Hoffman et al. . |
| 4,910,122 | 3/1990 | Arnold et al. . |
| 5,541,037 | 7/1996 | Hatakeyama et al. . |
| 5,569,784 | 10/1996 | Watanabe et al. . |
| 5,635,333 * | 6/1997 | Petersen et al. ...................... 430/311 |
| 5,756,255 * | 5/1998 | Sato et al. ......................... 430/270.1 |
| 5,851,730 * | 3/1999 | Thackeray et al. .................. 430/327 |
| 5,886,102 * | 3/1999 | Sinta et al. ............................ 525/154 |

* cited by examiner

*Primary Examiner*—John S. Chu
(74) *Attorney, Agent, or Firm*—Peter F. Corless; Darryl P. Frickey; Edwards & Angell, LLP

(57) ABSTRACT

The invention provides new light absorbing crosslinking compositions suitable for use as an antireflective composition, particularly for deep UV applications. The antireflective compositions of the invention comprise a photoacid generator that is activated during exposure of an overcoated photoresist. Antireflective compositions of the invention can significantly reduce undesired footing of an overcoated resist relief image.

24 Claims, No Drawings

ANTIREFLECTIVE COATING COMPOSITIONS COMPRISING PHOTOACID GENERATORS

This application is a Divisional of No. 08/797,741 filed Feb. 6, 1997, now U.S. Pat. No. 5,939,236.

BACKGROUND OF THE INVENTION

1. Field of the Invention

The present invention relates to compositions that reduce reflection of exposing radiation from a substrate back into an overcoated photoresist layer. More particularly, the invention relates to antireflective coating compositions that contain a photoacid generator compound that can reduce undesired footing or notching of an overcoated photoresist relief image.

2. Background Art

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions in general are known to the art and described by Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the more important steps in attaining high resolution photoresist images.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength), KrF excimer laser light (248.4 nm) and ArF excimer laser light (193 nm). The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Another approach used to reduce the problem of reflected radiation has been the use of a radiation absorbing layer interposed between the substrate surface and the photoresist coating layer. See, for example, PCT Application WO 90/03598, EPO Application No. 0 639 941 A1 and U.S. Pat. Nos. 4,910,122, 4,370,405 and 4,362,809, all incorporated herein by reference for their teaching of antireflective (antihalation) compositions and the use of the same. Such layers have also been referred to as antireflective layers or antireflective compositions or "ARCs".

In Shipley Company's European Application 542 008 A1 (incorporated herein by reference) highly useful antihalation (antireflective) compositions are disclosed that comprise a resin binder and a crosslinker compound.

While it has been found that prior antireflective compositions may be effective for many antireflective applications, prior compositions also may pose some potential performance limitations. e.g. when the antireflective compositions are used with resist compositions to pattern features of sub-micron or sub-half micron dimensions. In particular, use of at least some prior antireflective compositions has resulted in undercutting of a developed resist relief image, known in the art as "notching". Another problem has been "footing", i.e. the failure to clear during development that results in an upwardly tapering relief image sidewall. Both notching and footing can compromise the resolution of the image patterned onto the underlying substrate.

It thus would be desirable to have new antireflective coating compositions.

SUMMARY OF THE INVENTION

The present invention provides new light absorbing compositions suitable for use as antireflective coating compositions, particularly for deep UV applications. The antireflective compositions of the invention in general comprise a resin binder and a photoacid generator that can reduce undesired notching and footing of an overcoated photoresist relief image.

It is believed that acids produced by photoacid generators of photoresists, particularly the strong photogenerated acids of chemically-amplified resists, can be highly susceptible to acid neutralization, particularly via base contamination from a substrate or antireflective composition coating layer that underlies a resist layer. Photogenerated acid loss from a resist layer also can occur via diffusion of the acid into an underlying antireflective composition coating layer. In either case of neutralization or diffusion, acid loss can compromise the resolution of the developed resist layer. Typical effects are footing or notching at the base of a resist relief image where the photogenerated acid concentration has been most significantly reduced through such diffusion or neutralization processes.

By incorporating a photoacid generator into the underlying antireflective composition coating layer in accordance with the present invention, sufficient acid can be generated in the antireflective composition layer during exposure of the resist layer to avoid such acid loss from the resist layer and to ensure that an effective amount of acid is present throughout the thickness of the resist layer. In other words, acid diffusion or neutralization from a resist layer can be compensated for by the presence of photogenerated acid in the antireflective composition layer and at the antireflective composition/resist layers interface. As a result, resist relief images having vertical profiles with little or no footing or notching can be produced. See, for instance, the results of the examples and comparative examples which follow.

In the case of crosslinking antireflective compositions of the invention, preferably the antireflective composition photoacid generator is not substantially activated during crosslinking of the antireflective composition. In particular, with respect to antireflective compositions that are thermally crosslinked, the antireflective composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkenyl having one or preferably two or more fluoro substituents.

Particularly preferred antireflective composition photoacid generators of the invention can be activated upon exposure to deep UV radiation, particularly about 248 nm and/or about 193 nm, so that the antireflective composition can be effectively used with overcoated deep UV photoresists. Suitably the photoacid generator of the antireflective composition and the photoacid generator of the photoresist composition will be activated at the same exposure wavelength. Sensitizer materials formulated into the photoresist composition and/or antireflective compositions also can be used to ensure that a single exposure wavelength will activate the photoacid generators of both the antireflective and photo[]resist compositions.

It is further preferred that an antireflective composition of the invention is used together with a photoresist composition where the antireflective composition photoactive compound and photoresist photoactive compound generate the same or approximately the same acid compound (photoproduct) upon exposure to activating radiation during irradiation of the photoresist layer, i.e. photoproducts that preferably have similar diffusion characteristics and similar acid strengths. It has been found that resolution of an overcoated resist relief image is even further enhanced with such matching of the respective antireflective composition and resist photoacid products. References herein to "substantially the same" antireflective composition and resist photoacid products means that those two photoproducts differ no more than no about 2 or 2.5 in $pK_a$ values (measured at 25° C.), preferably the two photoproducts differ no more than about 1 or 1.5 in $pK_a$ values, and still further preferably the two photoproducts differ no more than about 0.75 in $pK_a$ values. It is further preferred that such "substantially the same" antireflective composition and resist photoacid products differ in molecular weight by no more than about 40 percent, preferably by no more than about 20 percent, still more preferably by no more than about 15 percent. It is still further preferred that the antireflective composition and resist photoproducts are each of the same class of acids, e.g. that both photoproducts are sulfonate acids or both are halo-acids such as HBr and the like.

Preferred antireflective compositions of the invention contain a resin binder that contain one or more moieties that are chromophores for the exposure radiation of an overcoated resist composition. i.e. the moieties are capable of absorbing exposure radiation to thereby reduce reflections. For example, for preferred antireflective compositions used with a deep UV (DUV) photoresist, preferred chromophores include anthracenyl, particularly alkylene anthracene esters such as pendant groups of the formula —(C═O)O($CH_2$)$_n$anthracene, wherein n is an integer from 1 to about 6. Other preferred chromophores include quinolinyl and ring-substituted quinolinyl derivatives such as hydroxyquinolinyl, phenanthrenyl and acridine groups. Suitably about 5 to 90 percent of the units of a resin comprise such a chromophore, more preferably about 10 to 60 percent. Preferred resin binders of the invention have an optical density of at least about 4 units/$\mu$ at the exposure wavelength (e.g. 193 nm or 248 nm). Preferred resin binders also are capable of reaction with the crosslinker component, e.g. by a hydroxy or carboxy moiety on the resin or a "masked"

moiety such as an ester that can generate such a reactive group in the presence of acid or otherwise. Preferred antireflective composition resin binders with chromophore moieties are copolymers and are prepared by polymerizing two or more different monomers where at least one of the monomers includes a chromophore group. It has been found that this synthesis provides distinct advantages over functionalization of a preformed polymer to add chromophore groups.

Crosslinking antireflective compositions of the invention preferably also contain an acid or thermal acid generator to induce or promote crosslinking of one or more components of the antireflective composition. Generally preferred crosslinking antireflective compositions comprise a separate crosslinker component such as an amine-based material, e.g. a glycouril, benzoguanamine or melamine resin. Glycouril resins are particularly preferred, especially Powderlink 1174 available from American Cyanamid.

Antireflective compositions of the invention are most preferably used in combination with positive-acting chemically amplified photoresist compositions. Antireflective compositions of the invention are also suitably used with negative-acting photoresists as well as other types of positive resists.

The invention further provides methods for forming a photoresist relief image and novel articles of manufacture comprising substrates coated with an antireflective composition of the invention alone or in combination with a photoresist composition. Other aspects of the invention are disclosed infra.

DETAILED DESCRIPTION OF THE INVENTION

Antireflective compositions of the invention comprise one or more photoacid generators (i.e. "PAG") that are suitably employed in an amount sufficient to inhibit or substantially prevent undesired notching or footing of an overcoated photoresist layer. Suitable amounts of the PAG can vary rather widely and can be readily determined empirically. In general, the one or more PAGs of an antireflective composition of the invention may be suitably employed in amounts of about 0.25 to 5 weight percent or less based on total weight of the antireflective composition. See the examples which follow for exemplary amounts. Particularly preferred amounts of a PAG of an antireflective composition also may vary depending on the characteristics and processing conditions of the photoresist that is used with the antireflective composition. For instance, if the photoresist photoacid generator produces a relatively strong acid photoproduct whereby the photoresist is post-exposure baked (PEB) at relatively low temperatures, then the photoacid product of the antireflective composition will be less likely to thermally decompose at such low PEB temperatures, resulting in a relatively higher effective concentration of acid in the antireflective composition. Accordingly, that antireflective composition can be effectively formulated with a relatively lower concentration of photoacid generator. Conversely, if a photoresist is used that is post-exposure baked at relatively high temperatures, then a portion of the photoacid product of the antireflective composition may be more likely to be thermally decomposed. In such case, the antireflective composition may be formulated with a relatively higher concentration of photoacid generator to ensure an effective concentration of photogenerated acid and maximum reductions of undesired footing.

Sulfonate compounds are preferred PAGs for antireflective compositions of the invention, particularly sulfonate salts. Two specifically preferred agents are the owing PAGS 1 and 2:

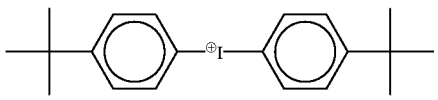

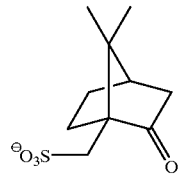

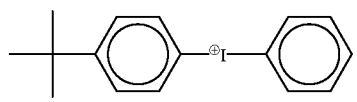

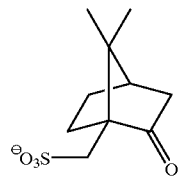

Such sulfonate compounds can be prepared as disclosed in Example 2 which follows, which details the synthesis of above PAG 1. Sulfonate PAG 2 above can be prepared by the same procedures of Example 2 which follows, except approximately molar equivalents of t-butyl benzene and benzene would be reacted together in the first step with acetic anhydride and $KIO_3$.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Onium salts also may be employed as photoacid generators of antireflective compositions of the invention. Onium salts that are weakly nucleophilic anions have been found to be particularly suitable. Examples of such anions are the halogen complex anions of divalent to heptavalent metals or non-metals, for example. Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442, 197; 4,603,101; and 4,624,912.

Other useful acid generators for antireflective compositions of the invention include the family of nitrobenzyl esters, and the s-triazine derivatives. Suitable s-triazine acid generators are disclosed, for example, in U.S. Pat. No. 4,189,323.

Halogenated non-ionic, photoacid generating compounds also may be suitable for antireflective compositions of the invention such as, for example, 1,1-bis[p-chlorophenyl]-2, 2,2-trichloroethane (DDT), 1,1-bis[p-methoxyphenyl]-2,2, 2-trichloroethane; 1,2,5,6,9,10-hexabromocyclodecane;

1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis[p-chlorophenyl]-2,2,2-trichloroethyl)acetamide; tris[2,3 -dibromopropyl] isocyanurate; 2,2-bis[p-chloropheny]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl )-2,2,2 trichloroethanol; tris(1,2,3-methanesulfonyl)benzene; and tris (trichloromethyl)triazine.

As discussed above, the resin binder component of the antireflective compositions of the invention preferably will effectively absorb reflections in the deep UV range (typically from about 100 to 300 nm). Thus, the resin binder preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophores, e.g. groups having from two to three or four fused or separate rings with 3 to 8 ring members in each ring and zero to three N, O or S atoms per ring. Such chromophores include substituted and unsubstituted phenanthryl, substituted and unsubstituted anthracyl, substituted and unsubstituted acridine, substituted and unsubstituted naphthyl, substituted and unsubstituted quinolinyl and ring-substituted quinolinyls such as hydroxyquinolinyl groups. Substituted or unsubstituted anthracyl groups are particularly preferred. For example, preferred resin binders have pendant anthracyl groups, particularly acrylic resins of the following Formula (I):

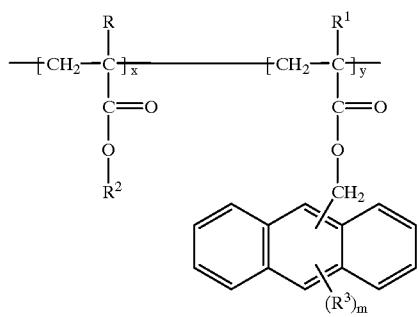

(I)

wherein each R and $R^1$ is independently a hydrogen or a substituted or unsubstituted alkyl group having from 1 to about 8 carbon atoms, preferably substituted or unsubstituted $C_{1-6}$ alkyl;

each $R^2$ is independently substituted or unsubstituted alkyl having 1 to about 10 carbon atoms, more typically 1 to about 6 carbons;

each $R^3$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

m is an integer of from 0 (where the anthracyl ring is fully hydrogen-substituted) to 9, and preferably m is 0, 1 or 2;

x is the mole fraction or percent of alkyl acrylate units in the polymer and preferably is from about 10 to about 80 percent; and y is the mole fraction or percent of anthracene units in the polymer and preferably is from about 5 to 10 to 90 percent. The polymer also may contain other units if desired, but preferably the polymer will contain at least about 10 mole percent of anthracene units. Hydroxyalkyl is a particularly preferred $R^2$ group, especially alkyl having a primary hydroxy group such as where $R^2$ is 2-hydroxyethylene (—$CH_2CH_2OH$). Preferably the resin binder contains 9-(methylene)anthracene ester units.

Another preferred resin binder comprises substituted or unsubstituted quinolinyl or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin binder is an acrylic polymer of the following Formula (II):

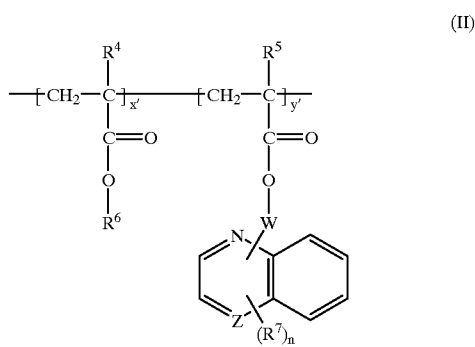

(II)

wherein each $R^4$ and $R^5$ is independently a hydrogen or a substituted or unsubstituted alkyl group having from 1 to about 8 carbon atoms, preferably substituted or unsubstituted $C_{1-6}$ alkyl;

each $R^6$ is independently substituted or unsubstituted alkyl having 1 to about 10 carbon atoms, more typically 1 to about 6 carbons;

W is a bond or substituted or unsubstituted alkylene having 1 to about 4 carbons, and preferably is a bond;

Z is a carbon, nitrogen, oxygen or sulfur;

each $R^7$ may be independently halogen (particularly F, Cl and Br), alkyl having 1 to about 8 carbon atoms, alkoxy having 1 to about 8 carbon atoms, alkenyl having 2 to about 8 carbon atoms, alkynyl having 2 to about 8 carbon atoms, cyano, nitro, etc.;

n is an integer of from 0 (where the ring is fully hydrogen-substituted) to 7, and preferably n is 0, 1 or 2.

x' is the mole fraction or percent of alkyl acrylate units in the polymer and preferably is from 10 to about 80 percent; and y' is the mole fraction or percent of quinolinyl or hydroxyquinolinyl units in the polymer and preferably is from about 5 to about 90 percent. The polymer also may contain other units if desired, but preferably the polymer will contain at least about 10 mole percent of quinolinyl and/or hydroxyquinolinyl units. Hydroxyalkyl is a particularly preferred $R^6$ group, especially alkyl having a primary hydroxy group such as where $R^6$ is 2-hydroxyethylene.

The above-mentioned substituted groups (including substituted groups $R^1$ through $R^7$ and W and substituted PAG substituents) may be substituted at one or more available positions by one or more suitable groups such as e.g.

halogen (particularly F, Cl and Br); cyano; hydroxyl, nitro, alkanoyl such as a $C_{1-6}$ alkanoyl group such as acyl and the like; alkyl groups having from 1 to about 8 carbon atoms; alkenyl and alkynyl groups having one or more unsaturated linkages and 2 to about 8 carbon atoms; alkoxy groups having from 1 to about 6 carbons; etc.

Resin binders for antireflective compositions of the invention are preferably synthesized by polymerizing two or more different monomers where at least one of the monomers includes a chromophore group, e.g. an anthracenyl, quinolinyl or hydroxyquinolinyl group. A free radical polymerization is suitably employed, e.g., by reaction of a plurality of monomers to provide the various units in the presence of a radical initiator preferably under an inert atmosphere (e.g.. $N_2$ or argon) and at elevated temperatures such as about 70° C. or greater, although reaction temperatures may vary depending onthe reactivity of the particular reagents employed and the boiling point of the reaction solvent (if a solvent is employed). See Example 1 which follows for exemplary reaction conditions. Suitable reaction temperatures for any particular system can be readily determined empirically by those skilled in the art based on the present disclosure. A reaction solvent may be employed if desired. Suitable solvents include alcohols such as propanols and butanols and aromatic solvents such as benzene, chlorobenzene, toluene and xylene. dimethylsulfoxide, dimethylformamide and THF are also suitable. The polymerization reaction also may be run neat. A variety of free radical initiators may be employed to prepare the copolymers of the invention. For example, azo compounds may be employed such as azo-bis-2,2'-isobutyronitrile (AIBN) and 1,1'-azobis (cyclohexanecarbonitrile). Peroxides, peresters, peracids and persulfates also can be employed.

Also, while less preferred, a preformed resin may be functionalized with chromophore units. For example, a glycidyl phenolic resin such as a glycidyl novolac can be reacted with an anthranyl carboxylic acid.

Resin binders of antireflective compositions of the invention preferably exhibit good absorbance at deep UV wavelengths such as within the range of from 100 to about 300 nm. More specifically, preferred resin binders of the invention have optical densities of at least about 3 absorbance units per micron (Absorb. units/$\mu$) at the exposing wavelength utilized (e.g. about 248 nm or about 193 nm), preferably from about 5 to 20 or more absorbance units per micron at the exposing wavelength, more preferably from about 4 to 16 or more absorbance units per micron at the exposing wavelength utilized. Higher absorbance values for a particular resin can be obtained by increasing the percentage of chromophore units on the resin.

Preferably resin binders of the above formulae will have a weight average molecular weight (Mw) of about 1,000 to about 10,000,000 daltons, more typically about 5,000 to about 1,000,000 daltons, and a molecular number molecular weight (Mn) of about 500 to about 1,000,000 daltons. Molecular weights (either Mw or Mn) of the polymers of the invention are suitably determined by gel permeation chromatography.

While antireflective composition resin binders having such absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of the resin binder component of the antireflective compositions of the invention may vary within relatively broad ranges, and in general the resin binder is employed in a concentration of from about 50 to 95 weight percent of the total of the dry components of the antireflective composition, more typically from about 60 to 90 weight percent of the total dry components (all components except solvent carrier).

Crosslinking-type antireflective compositions of the invention also contain a crosslinker component. A variety of crosslinkers may be employed, including those antireflective composition crosslinkers disclosed in Shipley European Application 542008 incorporated herein by reference. For example, suitable antireflective composition crosslinkers include amine-based crosslinkers such as a melamine materials, including melamine resins such as manufactured by American Cyanamid and sold under the tradename of Cymel 300, 301, 303, 350, 370, 380, 1116 and 1130. Glycourils are particularly preferred including glycourils available from American Cyanamid. Benzoquanamines and urea-based materials also will be suitable including resins such as the benzoquanamine resins available from American Cyanamid under the name Cymel 1123 and 1125, and urea resins available from American Cyanamid under the names of Beetle 60, 65 and 80. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

Low basicity antireflective composition crosslinkers are particularly preferred such as a methoxy methylated glycouril. A specifically preferred crosslinker is a methoxy methylated glycouril corresponding to the following structure (III):

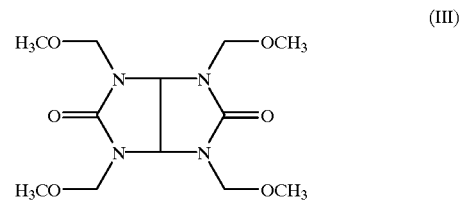

(III)

This methoxy methylated glycouril can be prepared by known procedures. The compound is also commercially available under the tradename of Powderlink 1174 from the American Cyanamid Co.

Other suitable low basicity crosslinkers include hydroxy compounds, particularly polyfunctional compounds such as phenyl or other aromatics having one or more hydroxy or hydroxy alkyl substituents such as a $C_{1-8}$ hydroxyalkyl substituents. Phenol compounds are generally preferred such as di-methanolphenol ($C_6H_3(CH_2OH)_2OH$) and other compounds having adjacent (within 1–2 ring atoms) hydroxy and hydroxyalkyl substitution, particularly phenyl or other aromatic compounds having one or more methanol or other hydroxylalkyl ring substituent and at least one hydroxy adjacent such hydroxyalkyl substituent.

It has been found that a low basicity crosslinker such as a methoxy methylated glycouril used in antireflective compositions of the invention can provide excellent lithographic performance properties, including significant reduction (SEM examination) of undercutting or footing of an overcoated photoresist relief image.

A crosslinker component of antireflective compositions of the invention in general is present in an amount of between 5 and 50 weight percent of total solids (all components except solvent carrier) of the antireflective composition, more typically in an amount of about 7 to 25 weight percent total solids.

Crosslinking antireflective compositions of the invention preferably further comprise an acid or thermal acid generator compound for catalyzing or promoting crosslinking during curing of an antireflective composition coating layer. Preferably a thermal acid generator is employed, i.e. a compound that generates acid upon thermal treatment. A variety of known thermal acid generators are suitably employed such as e.g. 2,4,4,6-tetrabromocyclohexadienone, benzoin tosylate, 2-nitrobenzyl tosylate and other alkyl esters of organic sulfonic acids. Compounds that generate a sulfonic acid upon activation are generally suitable. Typically a thermal acid generator is present in an antireflective composition in concentration of from about 0.1 to 10 percent by weight of the total of the dry components of the composition, more preferably about 2 percent by weight of the total dry components.

Also, as discussed above, rather than a thermal acid generator, an acid may be simply formulated into the antireflective composition, particularly for antireflective compositions that require heating to cure in the presence of acid so that the acid does not promote undesired reaction of composition components prior to use of the antireflective composition. Suitable acids include e.g. strong acids such as sulfonic acids such as toluene sulfonic acid and sulfonic acid, triflic acid, or mixtures of those materials.

The present invention also includes antireflective compositions that do not undergo significant cross-linking during intended use with a photoresist composition. Such non-crosslinking antireflective compositions include a photoacid generator as disclosed herein, but need not include a crosslinker component or an acid or thermal acid generator for inducing or promoting a crosslinking reaction. In other words, such non-crosslinking antireflective compositions typically will be essentially free (i.e. less than about 1 or 2 weight percent) or completely free of a crosslinker component and/or a thermal acid generator.

Antireflective compositions of the invention also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

To make a liquid coating composition, the components of the antireflective composition are dissolved in a suitable solvent such as, for example, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solids content of an antireflective composition varies from about 0.5 to 20 weight percent of the total weight of the antireflective composition, preferably the solids content varies from about 2 to 10 weight percent of the total weight of the antireflective composition.

A variety of photoresist compositions can be employed with the antireflective compositions of the invention, including positive-acting and negative-acting photoacid-generating compositions. Photoresists used with antireflective compositions of the invention typically comprise a resin binder and a photoactive component, typically a photoacid generator compound. Preferably the photoresist resin binder has functional groups that impart alkaline aqueous developability to the imaged resist composition.

As discussed above, particularly preferred photoresists for use with antireflective compositions of the invention are chemically-amplified resists, particularly positive-acting chemically-amplified resists compositions, where the photoactivated acid in the resist layer induces a deprotection-type reaction of one or more composition components to thereby provide solubility differentials between exposed and unexposed regions of the resist coating layer.

A number of chemically-amplified resist compositions have been described. e.g., in U.S. Pat. Nos. 4,968,581; 4,883,740; 4,810,613; 4,491,628 and 5,492,793, all of which are incorporated herein by reference for their teaching of making and using chemically amplified positive-acting resists. A particularly preferred chemically amplified photoresist for use with an antireflective composition of the invention comprises in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

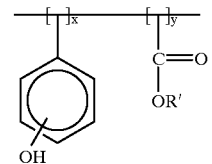

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.

The antireflective compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins. homo and copolymers or alkenyl phenols and homo and copolymers of N-hydroxyphenyl-maleimides.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Preferred negative-acting resist compositions for use with an antireflective composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Suitable photoacid generator compounds of resists used with antireflective compositions of the invention include the onium salts, such as those disclosed in U.S. Pat. Nos. 4,442,197, 4,603,101, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonyloxy ketones. See *J. of Photopolymer Science and Technology,* 4(3):337–340 (1991), for disclosure of suitable sulfonate PAGS, including benzoin tosylate, t-butylphenyl alpha-( p-toluenesulfonyloxy)-acetate and t-butyl alpha-(p-toluenesulfonyloxy)acetate. Preferred sulfonate PAGs are also disclosed in U.S. Pat. No. 5,344,742 to Sinta et al. The above camphorsulfonate PAGs 1 and 2 are also preferred photoacid generators for resist compositions used with the antireflective compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

Antireflective compositions of the invention that include a low basicity crosslinker such as a suitable glycouril are particularly useful with photoresists that generate a strong acid photoproduct upon exposure such as triflic acid, camphor sulfonate or other sulfonic acid, or other acid having a pKa (25° C.) of about 2 or less. Without wishing to be bound by theory, it is believed that antireflective compositions of the invention are particularly effective with such strong acid resists because the strong photogenerated acid will migrate from the resist and remain in the antireflective composition layer to a lesser extent relative to a comparable antireflective composition that contains a more basic crosslinker. That is, the low basicity crosslinkers of the invention will tie up strong photogenerated acids of an overcoated resist layer to a lesser extent than a more basic antireflective composition crosslinker. As a result, less acid loss from the resist layer will occur and resolution problems such as footing will be even further reduced.

In use, an antireflective composition of the invention is applied as a coating layer to a substrate may any of a variety of methods such as spin coating. The antireflective composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, ceramic, quartz or copper substrates may also be employed. Substrates used for liquid crystal display or other flat panel display applications are also suitably employed, for example glass substrates, indium tin oxide coated substrates and the like. Substrates for optical and optical-electronic devices (e.g. waveguides) also can employed.

Preferably the antireflective layer is cured before a photoresist composition is applied over the antireflective composition. Cure conditions will vary with the components of the antireflective composition. Thus, if the composition does not contain an acid or thermal acid generator, cure temperatures and conditions will be more vigorous than those of a composition containing an acid or acid generator compound. Typical cure conditions are from about 120° C. to 225° C. for about 0.5 to 40 minutes. Cure conditions preferably render the antireflective composition coating layer substantially insoluble to the photoresist solvent as well as an alkaline aqueous developer solution.

After such curing a photoresist is applied over the surface of the antireflective composition. As with application of the antireflective composition, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the antireflective composition layer and photoresist layer should occur.

The resist layer is then imaged with activating radiation through a mask in conventional manner. The exposure energy is sufficient to effectively activate the photoactive component of the resist system to produce a patterned image in the resist coating layer as well as activate the photoacid generator of at least a portion of the thickness of antireflective composition layer so that photogenerated acid from the PAG of the antireflective composition is present at the antireflective composition/resist coating layers interface. Typically, the exposure energy typically ranges from about 3 to 300 mJ/cm$^2$ and depending in part upon the exposure tool and the particular resist and resist processing that is employed. Generally, exposure doses used for typical imaging of a resist layer will be sufficient to photoactivate an effective of acid in the underlying antireflective composition layer.

The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. A plasma gas etch removes the crosslinked antihalation coating layer.

All documents mentioned herein are incorporated herein by reference. The following non-limiting examples are illustrative of the invention.

EXAMPLE 1

Preparation of Preferred Antireflective Composition Resin Binders

Hydroxyethyl methacrylate (HEMA)/methylanthracene methacrylate (ANTMA) copolymer (Formula I above) was prepared as follows.

A 300 ml 3N round bottom flask equipped with magnetic stirrer, condenser, nitrogen and vacuum inlet was charged with 16.0 g (0.1229 mol) HEMA (purified by distillation), 8.49 g (0.0307 mol) methylanthracene methacrylate. 0.2449 g (1 wt. %) AIBN and 180 ml THF. The reaction flask was quenched in liquid nitrogen while being purged with nitrogen. When the contents of the reaction flask were frozen, the flask was evacuated, then purged with nitrogen (3 times). The reaction mixture was stirred under reflux for 18 hours. The pale yellow polymer was precipitated into 3000 ml ether, filtered, then dried at 50° C. under vacuum (yield 86%) to provide the HEMA/ANTMA copolymer having 81 mole percent of —$CH_2C(CH_3)(CO_2CH_2CH_2OH)$— units and 19 mole percent of —$CH_2C(CH_3)(CO_2CH_2$-9-anthracene) units, a Mn of 2295. Mw of 19150 and a Tg of 101° C.

EXAMPLE 2

Preparation of di(4-t-butylphenyl)iodonium(+/−)-10-camphor sulfonate

The PAG 1 above can be prepared as follows. A 2L 3 neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for an additional 22 hours. The reaction mixture was cooled to 5–10° C. and water (600 ml) was added dropwise over a period of 30 minutes, maintaining the temperature below 30° C. (Note the first @75 ml should be added at a particular slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2L separating funnel and the aqueous solution of diaryliodonium hydrogensulfate transferred to a 3L reaction vessel. The solution was cooled to 5–10° C. (+/−)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (1L) and washed with dilute ammonium hydroxide (2.5 wt %. 5 ml 14.8 N $NH_4OH$+195 ml $H_2O$) until the washings are int he pH 7–8 range (1×200 ml) and then water (2×200 ml) to restore the pH to around 7. After drying ($MgSO_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@375 g PAG in @1150 ml IPA) in a 2L round bottom flask to give a homogeneous dark red solution. The hot solution was transferred to a 2L conical flask and allowed to cool. While this solution was still warm, hexane (500 ml) was added and crystals formed soon after. The crystallizing mixture was allowed to cool to room temperature and stored for 4 hours. The crystallizing solution was cooled to @5° C. in an ice-water bath for 1.5 hours and then the solid was collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (di-(4-t-butylphenyl)iodonium (+/−)-10-camphor sulfonate) was isolated as a free flowing white powder. At this stage about 285 g of PAC, is obtained. A second recrystallization can he performed in a similar manner.

EXAMPLES 3–4 AND COMPARATIVE EXAMPLES 1A–B AND 2

Preparation and Use of Antireflective Compositions of the Invention and Comparative Examples

EXAMPLE 3

A preferred antireflective composition of the invention was prepared by mixing the components set forth below, with component amounts expressed as parts by weight based on total weight of the liquid antireflective coating composition:

| | | |
|---|---|---|
| 1) | Resin binder: | 2.17% Polymer (novolac resin base with approximately 4% glycidyl groups replacing OH, and approximately 80% of OH groups replaced by —O(C=O)CH$_2$9-anthracene) |
| 2) | Crosslinker: | 0.61% Powderlink 1174 (American Cyanamid) |
| 3) | Acid: | 0.06% p-toluene sulfonic acid |
| 4) | Photoacid generator: | 0.16% di-t-butyl diphenyl iodonium camphorsulfonate |
| 5) | Surfactant: | 0.03% FC 171 (3M Co.) |
| 6) | Solvent: | 18% ethyl lactate; 10% cyclohexanone; and 68.97% propylene glycol monomethyl ether |

The antireflective composition was spin coated onto a single crystal silicon substrate 100 mm in diameter, and baked on a vacuum hot plate at 175° C. for 60 seconds. The resulting thickness was 600 angstroms. Over this antireflective composition layer a commercially available DUV positive photoresist (sold under the tradename of UVIIHS and available from the Shipley Company) was applied to a thickness of 7950 Å after a vacuum hot plate bake at 135° C. for 60 seconds. The overcoated resist layer was exposed to KrF excimer radiation (248 nm) with an ISI XLS projection stepper through a mask patterned with small lines and spaces with a dose of 12.0 mJ/cm$^2$. The wafer was then baked on a vacuum hot plate at 130° C. for 90 seconds, and then developed with CD-26 developer (Shipley Co.; alkaline aqueous solution) for 60 seconds. Resist footing was measured by cross-section SEMs (scanning electron micrographs) for both isolated and dense lines 0.25 μm wide and averaged 3 nm.

COMPARATIVE EXAMPLE 1A

The same antireflective composition was prepared as described above in Example 3, except the photoacid generator was omitted. This antireflective composition was spin coated onto a single crystal silicon substrate 100 mm in diameter, and baked on a vacuum hot plate at 205° C. for 60 seconds. The resulting thickness was 600 angstroms. Over this antireflective composition layer a commercially available DUV positive photoresist (sold under the tradename of UVIIHS and available from the Shipley Company) was applied to a thickness of 7950 Å after a vacuum hot plate bake at 135° C. for 60 seconds. The overcoated resist layer was exposed to KrF excimer radiation (248 nm) with an ISI XLS projection stepper through a mask patterned with small lines and spaces with a dose of 10.5 mJ/cm$^2$. The wafer was then baked on a vacuum hot plate at 130° C. for 60 seconds, and then developed with CD-26 developer (Shipley Co.; alkaline aqueous solution) for 60 seconds. Resist footing was measured by cross-section SEMs for both isolated and dense lines 0.25 μm wide and averaged 39 nm.

COMPARATIVE EXAMPLE 1B

The same antireflective composition was prepared as described above in Example 3, except N-(perfluoro-1-octanesulfonyloxy)-5-norbornene-2,3-dicarboximide was substituted for the diphenyl iodonium camphorsulfonate PAG of Example 3. N-(perfluoro-t-octanesulfonyloxy)-5-norbornene-2,3-dicarboximide is less thermally stable than diphenyl iodonium camphorsulfonate and can undergo decomposition at about 150° C. This antireflective composition was spin coated onto a single crystal silicon substrate 100 mm in diameter, and baked on a vacuum hot plate at 175° C. for 60 seconds The resulting thickness was 600 angstroms. Over this antireflective composition layer a commercially available DUV positive photoresist (sold under the tradename of UVIIHS and available from the Shipley Company) was applied to a thickness of 7950 Å after a vacuum hot plate bake at 130° C. for 60 seconds. The overcoated resist layer was exposed to KrF excimer radiation (248 nm) with an ISI XLS projection stepper through a mask patterned with small lines and spaces with a dose of 12.0 mJ/cm$^2$. The wafer was then baked on a vacuum hot plate at 135° C. for 90 seconds, and then developed with CD-26 developer (Shipley Co.; alkaline aqueous solution) for 60 seconds. Resist footing was measured by cross-section SEMs for both isolated and dense lines 0.25 μm wide and averaged 17 nm.

EXAMPLE 4

A further preferred antireflective composition of the invention was prepared by mixing the components set forth below, with component amounts expressed as parts by weight based on total weight of the liquid antireflective coating composition:

| | | |
|---|---|---|
| 1) | Resin binder: | 2.48% copolymer of 9-anthrylmethylmethacrylate (26 mol %) and 2-hydroxyethylmethacrylate (74 mol %) |
| 2) | Crosslinker: | 0.36% Powderlink 1174 (American Cyanamid) |
| 3) | Acid: | 0.04% p-nitrobenzyl tosylate |
| 4) | Photoacid generator: | 0.04% di-t-butyl diphenyl iodonium camphorsulfonate |
| 5) | Surfactant: | 0.03% FC 431 (3M Co.) |
| 6) | Solvent: | 97.05% propylene glycol monomethyl ether |

The antireflective composition was spin coated onto a single crystal silicon substrate 100 mm in diameter, and baked on a vacuum hot plate at 175° C. for 60 seconds. The resulting thickness was 605 angstroms. Over this antireflective composition layer a commercially available DUV positive photoresist (sold under the tradename of UVIIHS and available from the Shipley Company) was applied to a thickness of 8620 Å after a vacuum hot plate bake at 135° C. for 60 seconds. The overcoated resist layer was exposed to KrF excimer radiation (248 nm) with an ISI XLS projection stepper through a mask patterned with small lines and spaces with a dose of 11.0 mJ/cm$^2$. The wafer was then baked on a vacuum hot plate at 130° C. for 90 seconds, and then developed with CD-26 developer (Shipley Co.; alkaline aqueous solution) for 60 seconds. Resist footing was measured by cross-section SEMs for both isolated and dense lines 0.25 μm wide and averaged approximately 12 nm.

COMPARATIVE EXAMPLE 2

The same formulation was prepared as described above in Example 4, except the photoacid generator was omitted. This formulation was spin coated onto a single crystal silicon substrate 100 mm in diameter, and baked on a vacuum hot plate at 175° C. for 60 seconds. The resulting thickness was 600 angstroms. Over this antireflective composition layer a commercially available DUV positive photoresist (sold under the tradename of UVIIHS and available from the Shipley Company) was applied to a thickness of 7950 Å after a vacuum hot plate bake at 135° C. for 60 seconds. The overcoated resist layer was exposed to KrF excimer radiation (248 nm) with an ISI XLS projection stepper through a mask patterned with small lines and spaces with a dose of 10.8 mJ/cm$^2$. The wafer was then baked on a vacuum hot plate at 130° C. for 60 seconds, and then developed with CD-26 developer (Shipley Co.; alkaline aqueous solution) for 60 seconds. Resist footing was measured by cross-section SEMs for both isolated and dense lines 0.25 μM wide and averaged 27 nm.

The foregoing description of the invention is merely illustrative thereof, and it is understood that variations and modifications can be effected without departing from the scope or spirit of the invention as set forth in the following claims.

What is claimed is:

1. A method for forming a photoresist relief image comprising:
   (a) applying on a substrate a layer of an antireflective composition comprising a photoacid generator compound, an acid or thermal acid generator compound and a crosslinker, and crosslinking the antireflective layer;
   (b) applying a layer of the photoresist composition over the antireflective composition layer;
   (c) exposing the photoresist layer to activating radiation whereby the photoacid generator of the antireflective composition generates acid;
   (d) developing the exposed photoresist.

2. The method of claim 1 wherein the antireflective layer is thermally cured prior to applying the photoresist composition layer.

3. The method of claim 2 wherein the photoacid generator of the antireflective composition is not substantially activated during thermal cure of the antireflective layer.

4. The method of claim 1 wherein said exposing of the photoresist layer defines a latent relief image in the photoresist layer.

5. The method of claim 1 wherein the antireflective composition layer is not exposed to radiation activating for the photoacid generator prior to the exposing of the photoresist layer to activating radiation.

6. The method of claim 1 where the photoacid generator compound is substantially stable upon exposure to temperatures of from about 110 to 175° C. for at least about 1 minute.

7. The method of claim 1 where the photoacid generator compound generates acid upon exposure to an effective amount of DUV radiation.

8. The method of claim 1 wherein the antireflective composition comprises a resin binder substituted with anthracenyl units and contains a photoacid generator compound.

9. The method of claim 8 where the antireflective composition layer further contains a crosslinker.

10. The method of claim 9 wherein the crosslinker is an amine based material.

11. A method for forming a photoresist relief image comprising:
   (a) applying on a substrate a layer of an antireflective composition comprising a photoacid generator compound and a resin containing anthracenyl groups;
   (b) applying a layer of a photoresist composition over the antireflective composition layer;
   (c) exposing the photoresist layer to activating radiation whereby the photoacid generator of the antireflective composition generates acid; and
   (d) developing the exposed photoresist.

12. The method of claim 11 wherein the antireflective composition further contains a crosslinker.

13. The method of claim 12 wherein the crosslinker is an amine based material.

14. A method for forming a photoresist relief image comprising:
   (a) applying on a substrate a layer of an antireflective composition comprising a photoacid generator compound and an acid or thermal acid generator compound;
   (b) applying a layer of a photoresist composition over the antireflective composition layer;
   (c) exposing the photoresist layer to activating radiation whereby the photoacid generator of the antireflective composition generates acid; and
   (d) developing the exposed photoresist.

15. The method of claim 14 wherein the antireflective composition comprises a resin having anthracenyl groups.

16. The method of claim 14 wherein the antireflective composition further contains a crosslinker.

17. The method of claim 16 wherein the crosslinker is an amine based material.

18. A method for forming a photoresist relief image comprising:
   (a) applying on a substrate a layer of an antireflective composition comprising a photoacid generator compound and an acid or thermal acid generator compound;
   (b) applying a layer of a photoresist composition over the antireflective composition, the photoresist composition comprising a resin and a photoacid generator compound;
   (c) exposing the photoresist layer to activating radiation whereby the activating radiation results in 1) a photogenerated acid to be produced from the photoacid generator of the antireflective composition and 2) a photogenerated acid to be produced from the photoacid generator of the photoresist; and
   (d) developing the exposed photoresist.

19. The method of claim 18 wherein the antireflective layer is thermally cured prior to applying the photoresist composition layer.

20. The method of claim 19 wherein the photoacid generator of the antireflective composition is not substantially activated during the thermal cure of the antireflective layer.

21. The method of claim 18 wherein the antireflective composition layer is not exposed to radiation activating for the photoacid generator prior to the exposing of the photoresist layer to activating radiation.

22. The method of claim 18 wherein the photoresist layer is exposed to radiation having a wavelength of about 248 nm.

23. The method of claim 18 wherein the photoresist layer is exposed to radiation having a wavelength of about 193 nm.

24. The method of claim 18 wherein the antireflective comprises a resin having anthracenyl units.

* * * * *